United States Patent
Krishnamoorthy (10) Patent No.: US 7,755,432 B1
(45) Date of Patent: Jul. 13, 2010

(54) SHORT CIRCUIT PROTECTION CIRCUITS AND METHODS

(75) Inventor: Ravishanker Krishnamoorthy, Singapore (SG)

(73) Assignee: Marvell International Ltd., Hamilton (BM)

( * ) Notice: Subject to any disclaimer, the term of this patent is extended or adjusted under 35 U.S.C. 154(b) by 44 days.

(21) Appl. No.: 12/259,215

(22) Filed: Oct. 27, 2008

Related U.S. Application Data (60) Provisional application No. 60/991,329, filed on Nov. 30, 2007.

(51) Int. Cl.
*H03F 1/52* (2006.01)
(52) U.S. Cl. .................... 330/298; 330/207 P
(58) Field of Classification Search ............ 330/207 P, 330/207 A, 251, 298; 455/117
See application file for complete search history.

(56) References Cited

U.S. PATENT DOCUMENTS

| | | | | |
|---|---|---|---|---|
| 5,973,569 A | * | 10/1999 | Nguyen | 330/298 |
| 6,469,575 B1 | * | 10/2002 | Oki et al. | 330/10 |
| 7,557,660 B2 | * | 7/2009 | Tsurumi | 330/298 |
| 2008/0164944 A1 | * | 7/2008 | Tai | 330/207 P |

* cited by examiner

*Primary Examiner*—Khanh V Nguyen (57) ABSTRACT

In one embodiment the present invention includes a circuit comprising an amplifier, a first monitor circuit, a second monitor circuit, a third monitor circuit, and a control circuit. The amplifier comprises a first transistor and a second transistor driven by first and second signals, respectively. The amplifier stage provides an amplifier output signal through the output terminal of the amplifier stage. The first monitor circuit generates an output signal indicating a condition of the first signal. The second monitor circuit generates an output signal indicating a condition of the second signal. The third monitor circuit generates an output signal indicating a condition of the amplifier output signal. If a short circuit condition is indicated by the monitor circuits, the control circuit generates a shut down.

22 Claims, 5 Drawing Sheets

Fig. 5

SHORT CIRCUIT PROTECTION CIRCUITS AND METHODS

CROSS REFERENCE TO RELATED APPLICATIONS

This application is a non-provisional of and claims the benefit of priority from U.S. Patent Application No. 60/991,329, filed Nov. 30, 2007, entitled "Short Circuit Protection Circuit for Class AB Amplifiers," naming Ravishanker Krishnamoorthy as inventor.

BACKGROUND

The present invention relates to circuits and methods for short circuit protection.

Many electronic products are made up of different integrated circuits (ICs) which are assembled to interface with each other and to other electronic devices. Some electronic assemblies may also be manufactured to interface with other assemblies. After final manufacturing is complete, these assemblies may make up a complete electronic product which may be used by an end user. A hard disk drive is an example of an assembly which may be installed or assembled inside another assembly such as a computer, for example.

These ICs and electronic assemblies may be handled during test and assembly of an intermediate or final product. The handling of these devices may cause inadvertent short circuits on the outputs of the integrated circuit or assembly. In a short circuit condition, an output of a device may be inadvertently connected to ground or a power supply terminal. This condition may cause increases in voltages or currents that may damage devices (e.g., transistors) in the IC. Short circuit conditions may be caused by a wide variety of manufacturing or end user factors.

Figure 1:
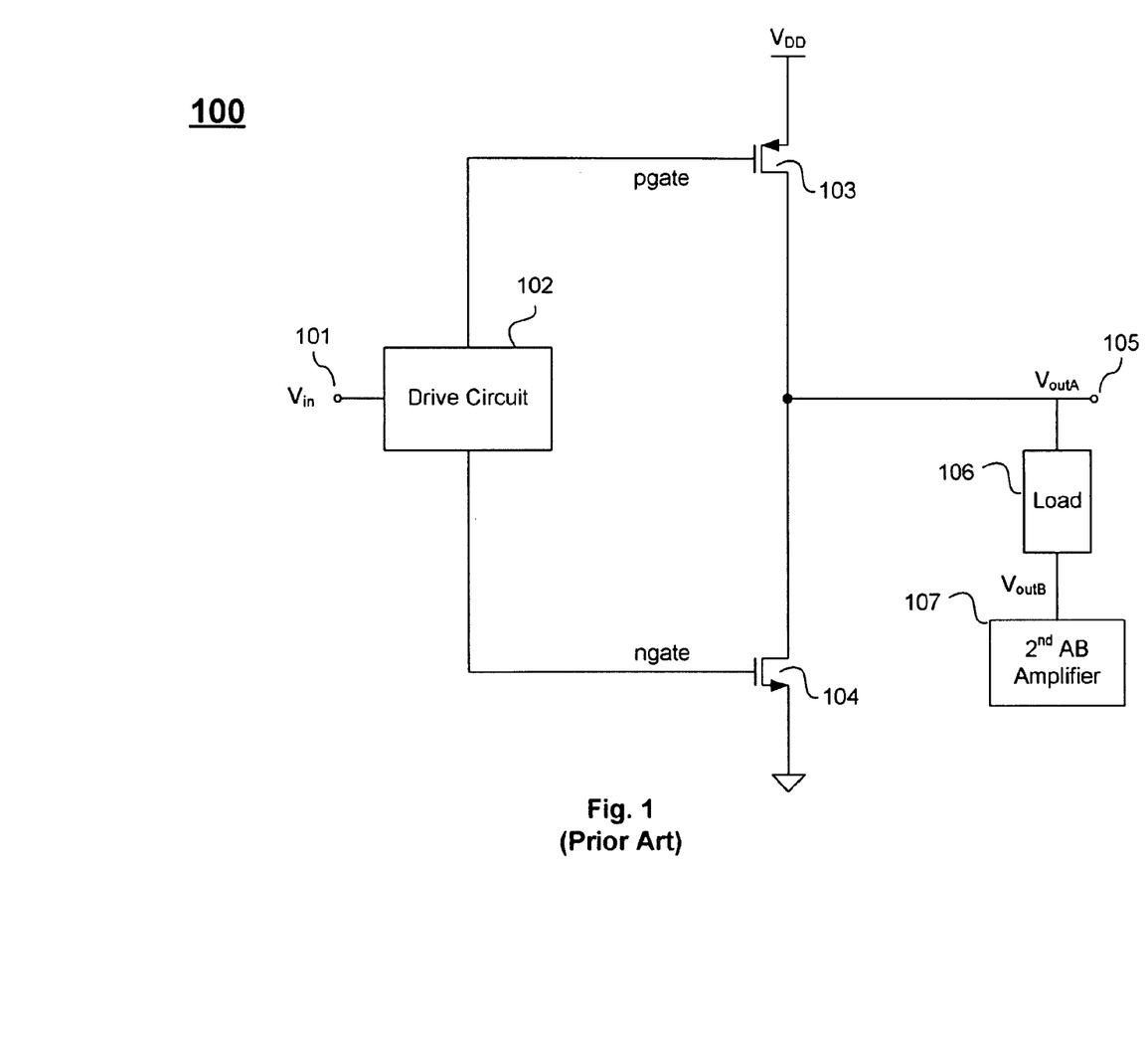
FIG. 1 illustrates a short circuit condition in an amplifier circuit.

FIG. 1 illustrates a short circuit condition in an amplifier circuit. Amplifier 100 is a class AB amplifier, which includes an input terminal 101 for receiving an input signal, a drive circuit for amplifying the input signal and generating drive signals to control the gate terminals of output transistors 103 and 104. PMOS transistor 103 has a gate ("pgate") coupled to receive a drive signal, a source terminal coupled to a power supply Vdd, and a drain coupled to an output terminal 105 of the amplifier. PMOS transistor 103 receives the drive signal on "pgate" and generates an output current based on the voltage of the drive signal. Similarly, NMOS transistor 104 has a gate ("ngate") coupled to receive a drive signal, a source terminal coupled to a ground, and a drain coupled to an output terminal 105 of the amplifier. NMOS transistor 103 receives the drive signal on "ngate" and generates an output current based on the voltage of the drive signal. In this example, the output terminal 105 of amplifier 100 is connected to drive one terminal of a differential load 106. The other terminal of load 106 is coupled to a second amplifier 107. A short circuit condition may occur if the output terminal 105 is inadvertently electrically connected (e.g., with zero resistance) to either the power supply terminal Vdd or ground. In either case, the voltages across the devices may be larger than the maximum allowable voltages, and the devices can be damaged or destroyed, resulting in a failure of the amplifier.

The present invention solves these and other problems by providing circuits and methods for short circuit protection.

SUMMARY

Embodiments of the present invention include systems and methods of short circuit protection. In one embodiment, the invention includes a circuit comprising an amplifier, a first monitor circuit, a second monitor circuit, a third monitor circuit, and a control circuit. The amplifier stage comprises a first transistor and a second transistor. The first transistor has a first terminal coupled to a first reference voltage, a second terminal coupled to an amplifier output terminal, and a control terminal coupled to receive a first signal. The second transistor has a first terminal coupled to the second terminal of the first transistor and the amplifier output terminal, a second terminal coupled to a second reference voltage, and a control terminal coupled to receive a second signal. The amplifier stage provides an amplifier output signal through the output terminal of the amplifier stage. The first monitor circuit is coupled to receive the first signal. The first monitor circuit generates an output signal indicating a condition of the first signal. The second monitor circuit is coupled to receive the second signal. The second monitor circuit generates an output signal indicating a condition of the second signal. The third monitor circuit is coupled to receive the amplifier output signal. The third monitor circuit generates an output signal indicating a condition of the amplifier output signal. The control circuit is coupled to receive the output signals from the first, second, and third monitor circuits. The control circuit generates a shut down signal based on the first signal, the second signal, and the amplifier output signal if a short circuit condition is indicated by the output signals of the first, second, and third monitor circuits.

In one embodiment, first monitor circuit is a first comparator, the second monitor circuit is a second comparator, and the third monitor circuit is a third comparator.

In one embodiment, the first comparator generates an output signal indicating that a voltage of the first signal is above or below a first threshold voltage, the second comparator generates an output signal indicating that a voltage of the amplifier output signal is above or below a second threshold voltage, and the third comparator generates an output signal indicating that a voltage of the second signal is above or below a third threshold voltage.

In one embodiment, first and third monitor circuits are current comparators.

In one embodiment, the first monitor circuit comprises a transistor having a gate terminal, a source terminal, and a drain terminal. The gate terminal is coupled to receive the first signal. The source terminal is coupled to the first reference voltage. The drain terminal is coupled to a first current source. The third monitor circuit comprises a transistor having a gate terminal, a source terminal, and a drain terminal. The gate terminal is coupled to receive the second signal. The source terminal is coupled to the second reference voltage. The drain terminal coupled to a second current source.

In one embodiment, the control circuit is a digital logic circuit.

In one embodiment, the control circuit comprises a first AND gate having a first input coupled to an output of the first monitor circuit and a second input coupled to an output of the third monitor circuit, and a second AND gate having a first input coupled to an output of the second monitor circuit and a second input coupled to an output of the third monitor circuit.

In one embodiment, the control circuit further comprises an OR gate having a first input coupled to an output of the first AND gate and a second input coupled to an output of the second AND gate.

In one embodiment, the control circuit further comprises a first inverter having an input coupled to an output of the second monitor circuit and an output coupled to the first input of the second AND gate, and a second inverter having an input coupled to an output of the third monitor circuit and an output coupled to the second input of the first AND gate.

In one embodiment, the first reference voltage is a power supply voltage.

In one embodiment, the second reference voltage is ground.

In one embodiment, the present invention includes a method comprising coupling a first current from a first reference voltage to an output terminal through a first transistor, wherein the coupling is controlled by a first signal received at a control terminal of the first transistor. A second current is coupled from a second reference voltage to the output terminal through a second transistor, wherein the coupling is controlled by a second signal received at a control terminal of the second transistor. The first and second currents are combined at an output terminal to generate a amplifier output signal. The method further includes monitoring the first signal, and in accordance therewith, generating a first output signal indicating a condition of the first signal, monitoring the second signal, and in accordance therewith, generating a second output signal indicating a condition of the second signal, and monitoring the amplifier output signal, and in accordance therewith, generating a third output signal indicating a condition of the amplifier output signal. A shut down signal is generated based on the output signals of the first, second, and third monitor circuits if the output terminal has been electrically shorted to first or second reference voltages.

In one embodiment, monitoring the first, second, and third signals comprises comparing the first signal to a first threshold, comparing the second signal to a second threshold, and comparing the third signal to a third threshold.

In one embodiment, generating an output signal indicating the condition of the first signal comprises generating an output signal indicating that a voltage of the first signal is above or below a first threshold voltage. The generating an output signal indicating the condition of the second signal comprises generating an output signal indicating that a voltage of the amplifier output signal is above or below a second threshold voltage. The generating an output signal indicating the condition of the second signal comprises generating an output signal indicating that a voltage of the second signal is above or below a third threshold voltage.

In one embodiment, monitoring the first signal comprises generating a first current using the first signal and comparing the first current to a second current.

In one embodiment, monitoring the second signal comprises generating a first current using the second signal and comparing the first current to a second current.

In one embodiment, monitoring the amplifier output signal comprises comparing a voltage on the amplifier output terminal to a third reference voltage In one embodiment, generating the shutdown signal comprises processing the first output signal, second output signal, and third output signal digitally.

In one embodiment, generating the shutdown signal comprises performing a first logical AND operation on the first and third output and performing a second logical AND on the second and third output.

In one embodiment, generating the shutdown signal comprises performing a logical OR operation on outputs of the first and second logical AND operations.

In one embodiment, generating the shutdown signal comprises performing a logical inversion on the second output and performing a logical inversion on the third output.

In one embodiment, the invention includes a motor driver system. The motor driver system comprises a motor, an amplifier stage, a first monitor circuit, a second monitor circuit, a third monitor circuit, and a control circuit. The motor has at least a first and second terminal. The first terminal is coupled to a first amplifier and the second terminal is coupled to a second amplifier. Each amplifier comprises an amplifier stage. The amplifier stage comprises a first and second transistor. The first transistor has a first terminal coupled to a first reference voltage, a second terminal coupled to an amplifier output terminal, and a control terminal coupled to receive a first signal. The second transistor has a first terminal coupled to the second terminal of the first transistor and the amplifier output terminal, a second terminal coupled to a second reference voltage, and a control terminal coupled to receive a second signal. The amplifier stage provides an amplifier output signal through the output terminal of the amplifier stage. The first monitor circuit is coupled to receive the first signal. The first monitor circuit generates an output signal indicating a condition of the first signal. The second monitor circuit is coupled to receive the second signal. The second monitor circuit generates an output signal indicating a condition of the second signal. The third monitor circuit is coupled to receive the amplifier output signal. The third monitor circuit generates an output signal indicating a condition of the amplifier output signal. The control circuit is coupled to receive the output signals from the first, second, and third monitor circuits. The control circuit generates a shut down signal based on the output signals of the first, second, and third monitor circuits if the output terminal has been electrically shorted to first or second reference voltages.

The following detailed description and accompanying drawings provide a better understanding of the nature and advantages of the present invention.

DETAILED DESCRIPTION

Described herein are techniques for short circuit protection. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include modifications and equivalents of the features and concepts described herein.

Figure 2:
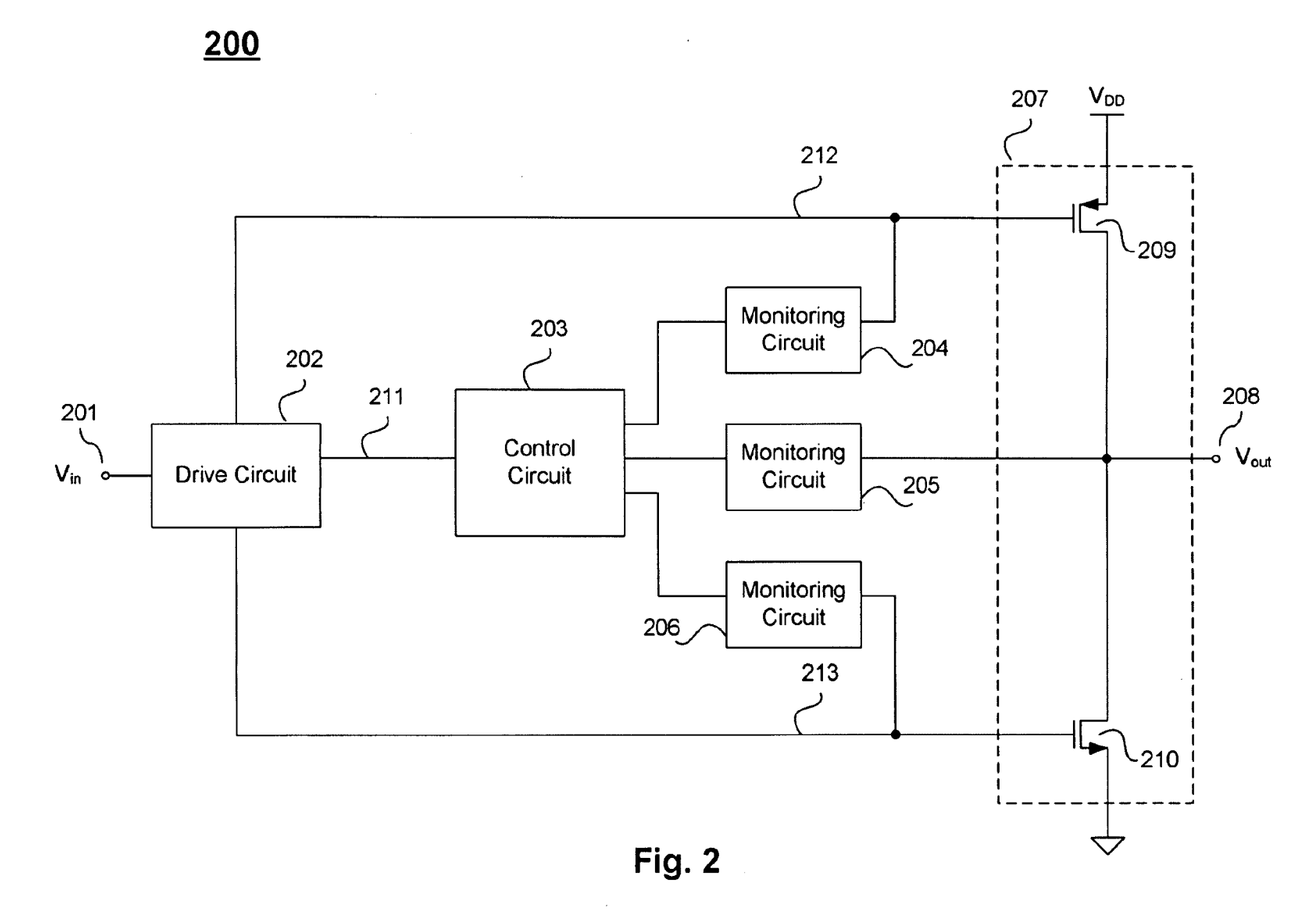
FIG. 2 illustrates a circuit for short circuit protection according to one embodiment of the present invention.

FIG. 2 illustrates a circuit 200 for short circuit protection according to one embodiment of the present invention. Circuit 200 includes a drive circuit 202, control circuit 203, monitoring circuits 204-206, and output stage 207. Output stage 207 includes transistor 209 and 210. Drive circuit 202 receives an input signal $V_{in}$ 201. Drive circuit 202 provides drive signals to the control terminals of transistors 209 and 210 at location 212 and 213, respectively.

The drive signals at location 212 and 213 control an output signal provided at output terminal 208 of output stage 207. A first terminal of transistor 209 is coupled to a reference voltage $V_{DD}$. A second terminal of transistor 209 is coupled to a first terminal of transistor 210 and an output terminal 208 of the output stage 207. The drive signal at location 212 is coupled to the control terminal of transistor 209. Transistor 209 couples current from reference voltage $V_{DD}$ to output terminal 208 according to the drive signal at location 212.

The second terminal of transistor 210 is coupled to a second reference voltage which is ground in this embodiment. The drive signal at location 213 is coupled to the control terminal of transistor 210. Transistor 210 couples current from output terminal 208 to ground according to the drive signal at location 213.

The drive signals (at location 212 and 213) and the output signal of the amplifier stage 207 are monitored to determine if a short circuit condition has occurred. Monitoring circuit 204 monitors the drive signal at location 212 and provides an output signal to control circuit 203. The output signal of monitoring circuit 204 may indicate a condition of the drive signal at location 212. For example, monitoring circuit 204 may output a signal indicating that the voltage of the drive signal is above or below a threshold voltage. Monitoring circuit 205 monitors the output signal at output terminal 208 and provides an output signal to control circuit 203. The output signal of monitoring circuit 205 may indicate a condition of the output signal of amplifier stage 207. For example, monitoring circuit 205 may output a signal indicating that the voltage of the output signal at output terminal 208 is above or below a threshold voltage. Monitoring circuit 206 monitors the drive signal at location 213 and provides an output signal to control circuit 203. The output signal of monitoring circuit 206 may indicate a condition of the drive signal at location 213. For example, monitoring circuit 205 may output a signal indicating that the voltage of the drive signal is above or below a threshold voltage. It is to be understood that different threshold voltages may be used depending on the process, size of the transistors used, the reference voltages used (e.g., power supply voltages or ground) or other design factors.

Control circuit 203 receives the signals from monitoring circuits 204-206 and processes the condition information to determine if output terminal 208 has been shorted to ground or Vdd. For example, drive circuit 202 may generate a drive signal at location 212 which will couple current from $V_{DD}$ to the output terminal 208 through transistor 209. Monitoring circuit 204 may receive the drive signal and generate an output signal indicating the condition of the drive signal to control circuit 203. Additionally, monitoring circuit 205 may receive the amplifier output signal on output terminal 208 and generate an output signal indicating the condition of the amplifier output signal to control circuit 203. When output terminal 208 has been shorted to ground, monitor circuit 205 signals the control circuit 203 that the output signal at the output terminal 208 is below a threshold. This threshold may be a voltage which is one-half of $V_{DD}$. Control circuit 203 compares the condition of the drive signal at location 212 and the condition of the output terminal 208, and may shut down the amplifier if the detected conditions indicate a short circuit. For example, if the drive signal at 212 is below a threshold voltage, and if the amplifier output is also below a threshold voltage, such a condition may indicate that the output is shorted to ground. Accordingly, control circuit may process the output of monitor circuits 204 and 205 and generate a shutdown signal to disable the amplifier. Disabling the amplifier may include shutting down an internal bias current source, for example, or any of a variety of shut down techniques. In one embodiment, a short circuit shutdown signal may be coupled to an integrated circuit pad and to an external pin for external fault monitoring, for example.

Similarly, drive circuit 202 may generate a drive signal at location 213, which will couple current from the output terminal 208 to ground through transistor 210. Monitoring circuit 206 may receive the drive signal and generate an output signal indicating the condition of the drive signal at 213 to control circuit 203. When output terminal 208 has been shorted to Vdd, monitor circuit 205 signals the control circuit 203 that the output signal at the output terminal 208 is above a threshold (e.g., ½ Vdd). Control circuit 203 compares the condition of the drive signal at location 213 and the condition of the output terminal 208, and may shut down the amplifier if the detected conditions indicate a short circuit. For example, if the drive signal at 213 is above a threshold voltage, and if the amplifier output is also above a threshold voltage, such a condition may indicate that the output is shorted to Vdd. Accordingly, control circuit 203 may process the output of monitor circuits 205 and 206 and generate a shutdown signal to disable the amplifier.

Figure 3:
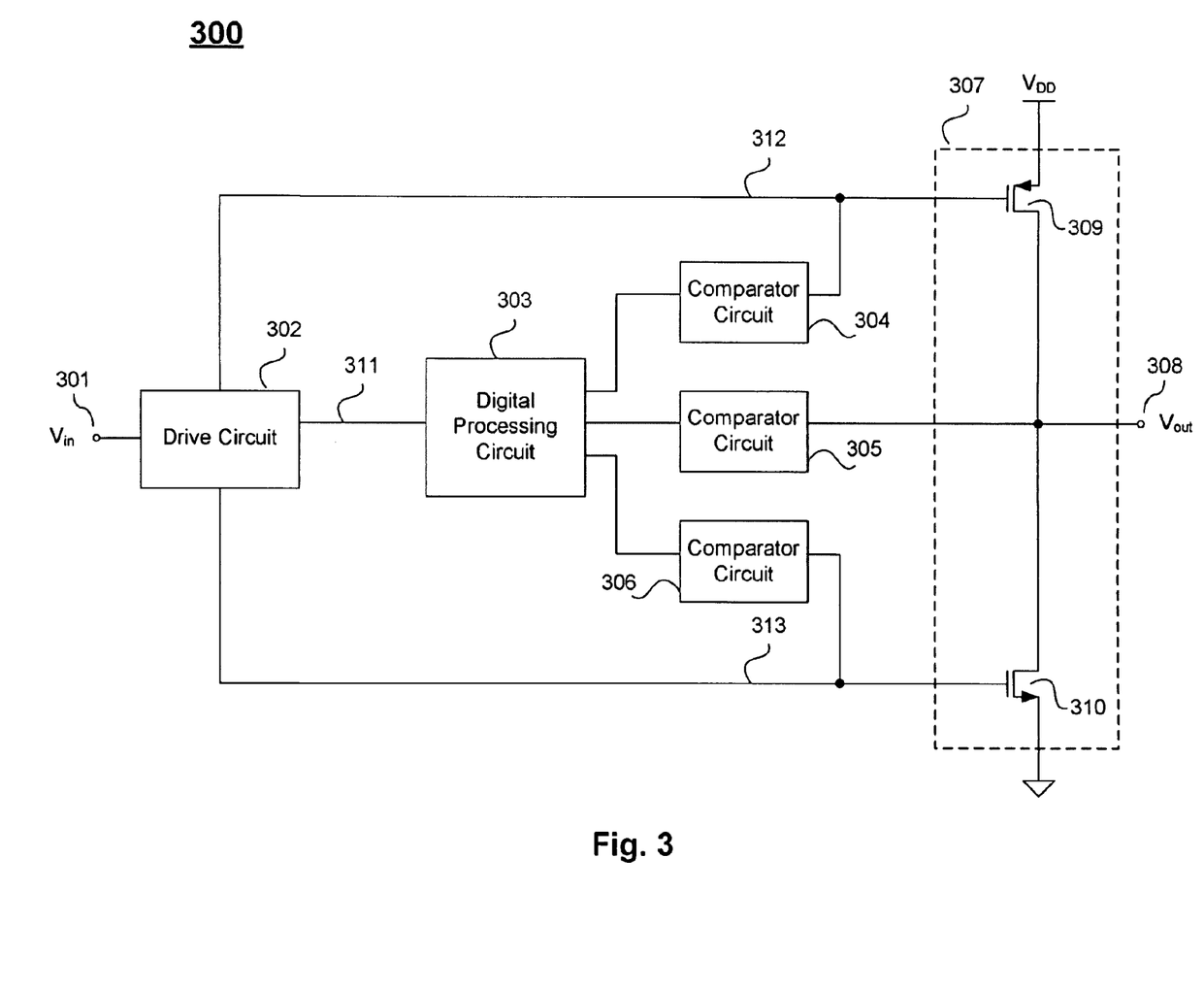
FIG. 3 illustrates a circuit for short circuit protection according to one embodiment of the present invention.

FIG. 3 illustrates a circuit 300 for short circuit protection according to another embodiment of the present invention. In this example, monitor circuits are implemented using comparator circuits and control circuit is implemented digitally as a digital processing circuit. For instance, circuit 300 includes a drive circuit 302, digital processing circuit 303, comparator circuits 304-306, and output stage 307. Drive circuit 302 receives an input signal $V_{in}$ 301 and provides drive signals at location 312 and 313. Comparator circuit 304 receives drive signal 312 and performs a comparison function against a threshold. Similarly, comparator circuit 305 receives an output signal at the output terminal 308 of the amplifier and performs a comparison function against a threshold. Finally, comparator circuit 306 receives a drive signal 313 and performs a comparison function against a threshold. In one embodiment described in more detail below, the comparison performed by comparator circuits is a current comparison. However, voltage comparison could be used in other implementations.

Digital processing circuit 303 includes a first input coupled to the output of comparator circuit 304, a second input coupled to the output of comparator circuit 305, and a third input coupled to the output of comparator circuit 306. Digital processing circuit applies digital logic processing on the comparator outputs to determine if a short circuit condition exists. For example, if the output of comparator circuit 304 indicates that the drive signal at 312 is below a threshold voltage and if the output of comparator circuit 305 indicates that the amplifier output is also below a threshold voltage, such a condition may indicate that the output is shorted to ground. Digital circuit 303 may process such condition information and generate a shutdown signal at 311 to turn off the drive circuit 302. As another example, if the output of comparator circuit 306 indicates that the drive signal at 313 is above a threshold voltage and if the output of comparator circuit 305 indicates that the amplifier output is also above a threshold voltage, such a condition may indicate that the output is shorted to Vdd. Digital circuit 303 may process such condition information and generate a shutdown signal.

Figure 4:
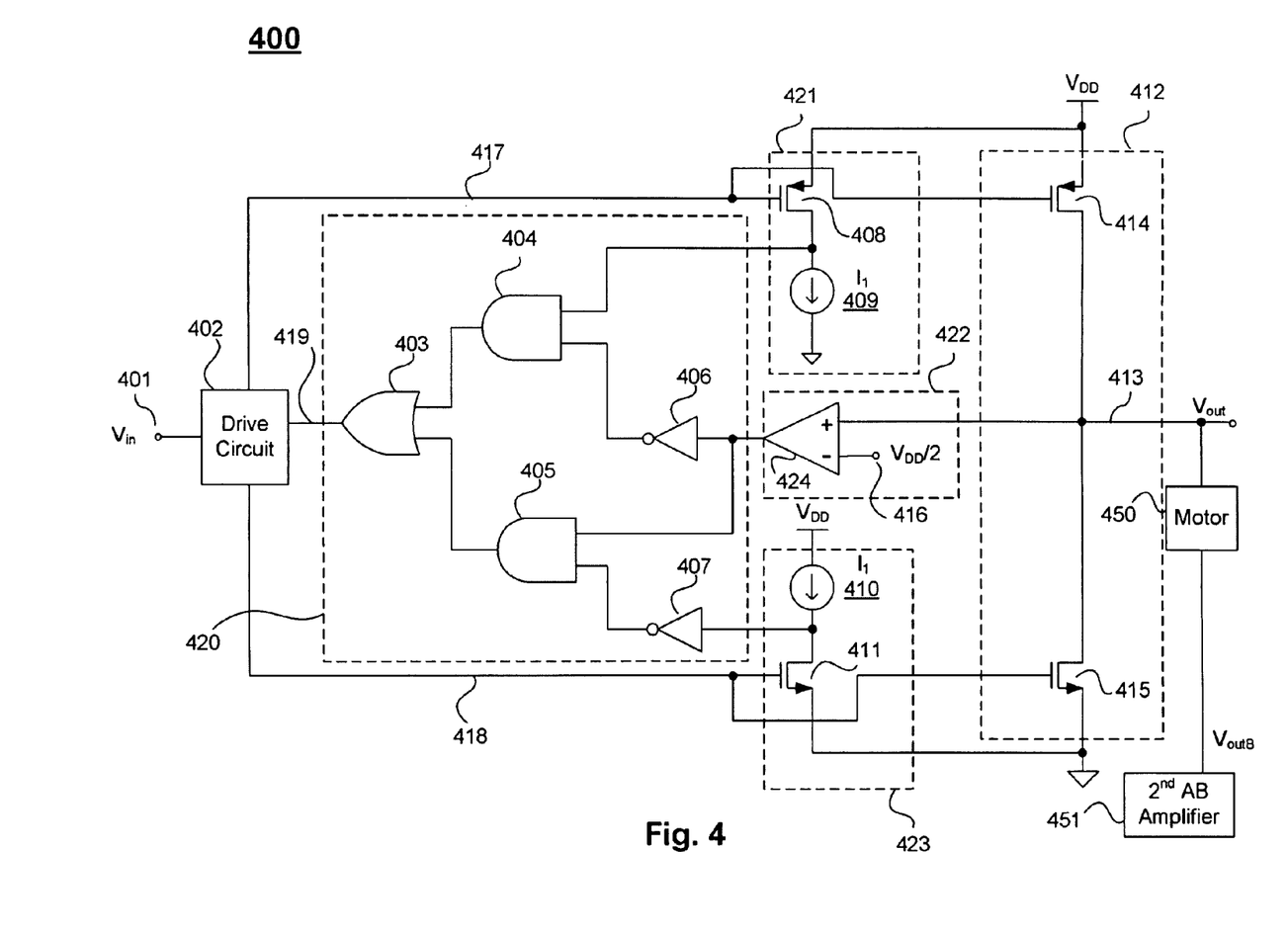
FIG. 4 illustrates a circuit for short circuit protection according to another embodiment of the present invention.

FIG. 4 illustrates a circuit 400 for short circuit protection according to another embodiment of the present invention. Circuit 400 includes a drive circuit 402, digital logic circuit 420 for processing digital signals, monitoring circuits 421-423, and output stage 412. Drive circuit 402 receives an input signal $V_{in}$. Drive circuit 402 provides drive signals at location 417 and 418. Circuit 400 operates in a similar fashion to circuit 300 of FIG. 3 described above. This example also illustrates an application of the present invention. Here, amplifier 400 is used as a motor driver circuit. For example, a motor driver may be used in a hard disc drive. The motor 450 includes at least a first and second terminal. The first terminal is coupled to a first amplifier 400 and the second terminal is coupled to a second amplifier 451, which may also include short circuit protection as described herein. The motor 450 acts as a load coupled between the two amplifiers. The amplifiers may drive the motor differentially, for example.

The drive signals at location 417 and 418 control an output signal provided at output terminal 413 of output stage 412. Output stage 412 includes transistor 414 and 415. A first terminal of transistor 414 is coupled to a reference voltage $V_{DD}$. A second terminal of transistor 414 is coupled to a first terminal of transistor 415 and an output terminal 413 of the output stage 412. The drive signal at location 417 is coupled to the control terminal of transistor 414. Transistor 414 couples current from reference voltage $V_{DD}$ to output terminal 413 according to the drive signal at location 417.

A first terminal of transistor 415 is coupled to a reference voltage—e.g. ground. A second terminal of transistor 415 is coupled to the second terminal of transistor 414 and output terminal 413 of the output stage 412. The drive signal at location 418 is coupled to the control terminal of transistor 415. Transistor 415 couples current from output terminal 413 to ground according to the drive signal at location 418.

The drive signals (at location 417 and 418) and the output signal of the amplifier stage 412 are monitored to determine if a short circuit condition has occurred. Monitoring circuit 412 monitors the drive signal at location 417 and provides an output signal to digital circuit 420. The output signal of monitoring circuit 421 may correspond to the drive signal at location 417. Monitoring circuit 422 monitors the output signal at output terminal 413 and provides an output signal to comparison circuit 410. The output signal of monitoring circuit 422 may correspond to the output signal of amplifier stage 412. Monitoring circuit 423 monitors the drive signal at location 418 and provides an output signal to comparison circuit 420. The output signal of monitoring circuit 423 may correspond to the drive signal at location 418.

Monitor circuit 421 in this example implementation is a current comparator including sense transistor 408 and current source 409. Sense transistor 408 has a first terminal coupled to Vdd, a control terminal coupled to the control terminal of transistor 414 and line 417, and a second control terminal coupled to current source 409. The second terminal is also coupled to the first input of an AND gate in digital logic 420. Accordingly, sense transistor receives the same drive signal as transistor 414. Sense transistor 408 generates a current based on the drive signal, which is compared with the current in current source 409. If the drive signal is below a threshold, the current through transistor 408 will be greater than the current into the current source, and transistor 408 pulls one input terminal of AND gate 404 a logic "high". Alternatively, if the drive signal is above a threshold, the current through transistor 408 will be less than the current into the current source, and current source pulls one input terminal of AND gate 404 a logic "low". Sense transistor 408 may be a smaller than, or even a fraction of the size of, transistor 414. Accordingly, a high logic value at the input terminal of AND gate 404 may correspond to transistor 414 coupling a high current from $V_{DD}$ to output terminal 413 (i.e., drive signal 417 is below a threshold). Under this condition, the output terminal should have an increasing voltage. If the voltage does not increase (i.e., if the output is shorted to ground), then an error condition may be detected. Similarly, a low logic value at the input terminal of AND gate 404 may correspond to transistor 414 coupling a lower current to the output terminal 413 (i.e., drive signal 417 is above a threshold). Under this condition, the output terminal should have a decreasing voltage. If the voltage does not decrease (i.e., if the output is shorted to Vdd), then an error condition may be detected.

Monitor circuit 422 includes comparator 424. One input terminal of the comparator 424 is coupled to receive the amplifier output signal from output terminal 413. The other input terminal of comparator 424 is coupled to receive a reference voltage 416, which in this example is a voltage that is one-half the difference between the two reference voltages $V_{DD}$ and ground. (e.g. $V_{DD}/2$). When the output signal is above $V_{DD}/2$, the output of comparator 424 generates a signal corresponding to logic high. When the output signal is below $V_{DD}/2$, the output of comparator 424 generates a signal corresponding to logic low.

Monitor circuit 423 in this example implementation is also a current comparator including sense transistor 411 and current source 410. Sense transistor 411 has a first terminal coupled to ground, a control terminal coupled to the control terminal of transistor 415 and line 418, and a second control terminal coupled to current source 410. The second terminal of transistor 411 is also coupled to the first input of an inverter gate 407 in digital logic 420. Accordingly, sense transistor 411 receives the same drive signal as transistor 415. Sense transistor 411 generates a current based on the drive signal, which is compared with the current in current source 409. If the drive signal is below a threshold, the current through transistor 411 will be less than the current from the current source, and current source 410 pulls one input terminal of inverter gate 407 a logic "high". Alternatively, if the drive signal is above a threshold, the current through transistor 411 will be greater than the current from the current source, and transistor 411 pulls one input terminal of inverter 407 a logic "low". Sense transistor 411 may be smaller than or a fraction of the size of transistor 415. Accordingly, a high logic value at the input terminal of inverter 407 may correspond to transistor 415 coupling a low current from output terminal 413 to ground (i.e., drive signal 418 is below a threshold). Under this condition, the output terminal should have an increasing voltage. If the voltage does not increase (i.e., if the output is shorted to ground), then an error condition may be detected. Similarly, a low logic value at the input terminal of inverter 407 may correspond to transistor 415 coupling a higher current from the output terminal 413 to ground (i.e., drive signal 418 is above a threshold). Under this condition, the output terminal should have a decreasing voltage. If the voltage does not decrease (i.e., if the output is shorted to Vdd), then an error condition may be detected.

Digital circuit 420 in this example includes inverters 406-407, AND gates 408-409, and OR gate 403. Digital circuit receives the outputs from the monitor circuits and determines if a condition exists indicating that the output terminal 413 has been shorted to ground or shorted to a voltage source. For example, if the thresholds in the current comparators are configured to switch from high to low when the drive signals cross Vdd/2, then the digital circuit will generate a shut down signal as follows:

Output Short Circuit to Ground:

Shutdown=[$P$gate(drive signal 417)<$V$th_$p$gate] AND [Vout<Vdd/2]

Output Short Circuit to Supply:

Shutdown=[$N$gate(drive signal 418)>$V$th_$n$gate] AND [Vout>Vdd/2]

Figure 5:
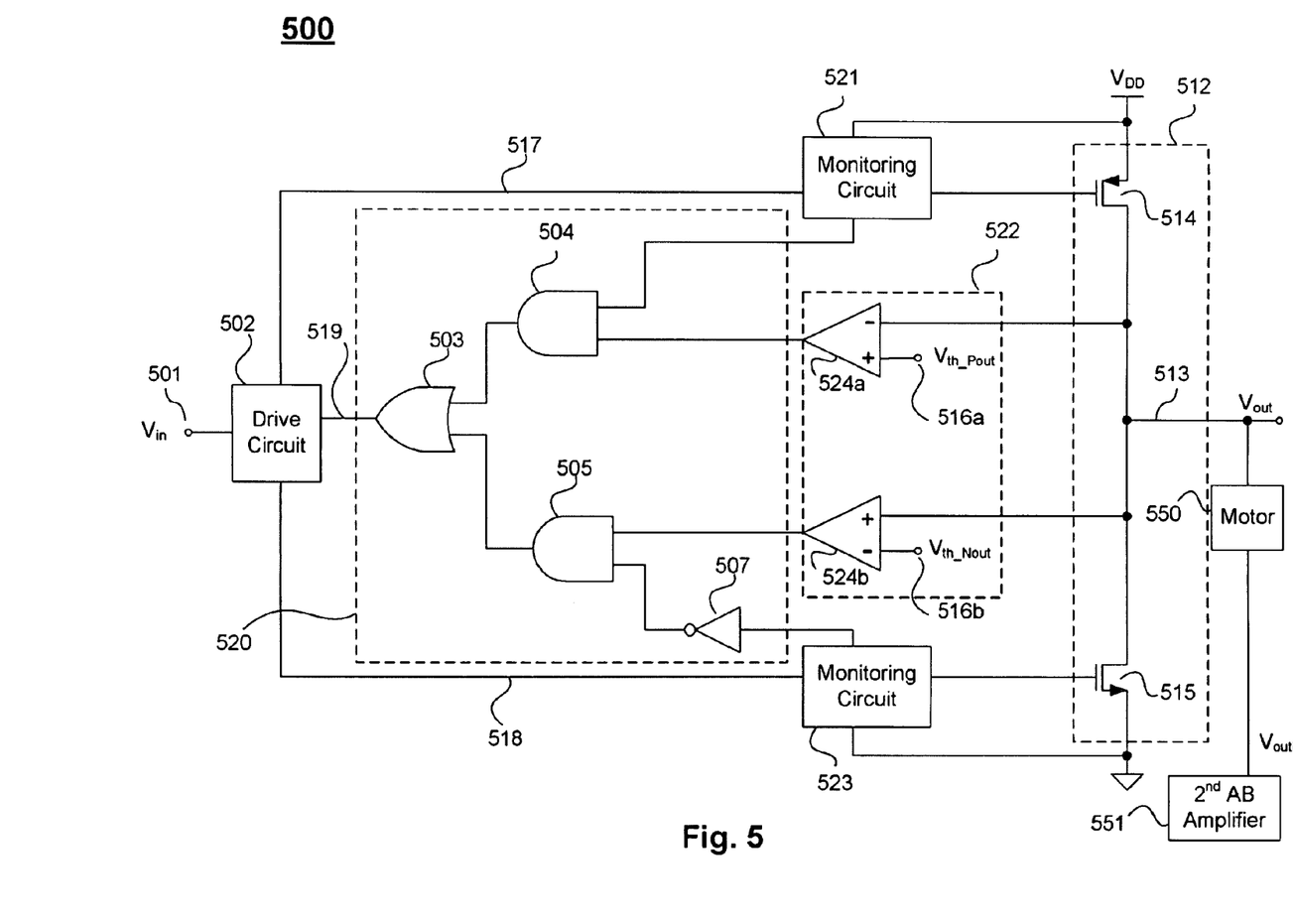
FIG. 5 illustrates an alternate circuit 500 for short circuit protection according to another embodiment of the present invention.

FIG. 5 illustrates an alternate circuit 500 for short circuit protection according to another embodiment of the present invention. Circuit 500 is similar to circuit 400 of FIG. 4.

In this embodiment, circuit 500 has multiple monitor circuit including comparator 524a and 524b. The output of comparator 524a is coupled to one input of AND gate 504 and the output of monitor circuit 522b is coupled to one input of AND gate 504.

Comparator 524a has one input terminal coupled to the output terminal 513 of output stage 512 and a second input 516a coupled to $V_{th\_Pout}$. In this embodiment, $V_{th\_Pout}$ may be set to detect a short which may load PMOS transistor 514 slightly. This short may result in an output voltage $V_{out}$ slightly lower than $V_{DD}$.

Comparator 524b has one input coupled to the output terminal 513 of output stage 512 and a second input 516b coupled to $V_{th\_Nout}$. In this embodiment, $V_{th\_Nout}$ may be set to a threshold to detect a short which may load NMOS transistor 515 slightly. This short may result in an output voltage $V_{out}$ slightly higher than ground.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. For example, while the above invention has been illustrated using certain device types, other polarities and other devices could also be used. It is also to be understood that any of a variety of reference voltages or thresholds could be used depending on the implementation. Based on the above disclosure and the following claims, other arrangements, embodiments, implementations and equivalents will be evident to those skilled in the art and may be employed without departing from the spirit and scope of the invention as defined by the claims.

What is claimed is:

1. A circuit comprising:
    an amplifier stage comprising,
        a first transistor having (i) a first terminal coupled to a first reference voltage, (ii) a second terminal coupled to an amplifier output terminal, and (iii) a control terminal coupled to receive a first signal,
        a second transistor having (i) a first terminal coupled to the second terminal of the first transistor and the amplifier output terminal, (ii) a second terminal coupled to a second reference voltage, and (iii) a control terminal coupled to receive a second signal,
        wherein the amplifier stage provides an amplifier output signal through the amplifier output terminal of the amplifier stage;
    a first monitor circuit coupled to receive the first signal, the first monitor circuit generating an output signal indicating a condition of the first signal;
    a second monitor circuit coupled to receive the second signal, the second monitor circuit generating an output signal indicating a condition of the second signal;
    a third monitor circuit coupled to receive the amplifier output signal, the third monitor circuit generating an output signal indicating a condition of the amplifier output signal; and
    a control circuit coupled to receive the output signals from the first, second, and third monitor circuits,
    wherein the control circuit generates a shut down signal based on the first signal, the second signal, and the amplifier output signal if a short circuit condition is indicated by the output signals of the first, second, and third monitor circuits.

2. The circuit of claim 1, wherein first monitor circuit is a first comparator, the second monitor circuit is a second comparator, and the third monitor circuit is a third comparator.

3. The circuit of claim 2, wherein the first comparator generates an output signal indicating that a voltage of the first signal is above or below a first threshold voltage, the third comparator generates an output signal indicating that a voltage of the amplifier output signal is above or below a second threshold voltage, and the second comparator generates an output signal indicating that a voltage of the second signal is above or below a third threshold voltage.

4. The circuit of claim 1, wherein the first and second monitor circuits are current comparators.

5. The circuit of claim 4, wherein the first monitor circuit comprises a transistor having (i) a gate terminal coupled to receive the first signal, (ii) a source terminal coupled to the first reference voltage, and (iii) a drain terminal coupled to a first current source, wherein the second monitor circuit comprises a transistor having (i) a gate terminal coupled to receive the second signal, (ii) a source terminal coupled to the second reference voltage, and (iii) a drain terminal coupled to a second current source.

6. The circuit of claim 1, wherein the control circuit is a digital logic circuit.

7. The circuit of claim 1, wherein the control circuit comprises:
    a first AND gate having (i) a first input coupled to an output of the first monitor circuit and (ii) a second input coupled to an output of the third monitor circuit, and
    a second AND gate having (i) a first input coupled to an output of the second monitor circuit and (ii) a second input coupled to an output of the third monitor circuit.

8. The circuit of claim 7, wherein the control circuit further comprises an OR gate having (i) a first input coupled to an output of the first AND gate and (ii) a second input coupled to an output of the second AND gate.

9. The circuit of claim 7 wherein the control circuit further comprises:
    a first inverter having (i) an input coupled to an output of the second monitor circuit and (ii) an output coupled to the first input of the second AND gate, and
    a second inverter having (i) an input coupled to an output of the third monitor circuit and (ii) an output coupled to the second input of the first AND gate.

10. The circuit of claim 1, wherein the first reference voltage is a power supply voltage.

11. The circuit of claim 1, wherein the second reference voltage is ground.

12. A method comprising:
    coupling a first current from a first reference voltage to an output terminal through a first transistor, wherein the coupling is controlled by a first signal received at a control terminal of the first transistor;
    coupling a second current from a second reference voltage to the output terminal through a second transistor, wherein the coupling is controlled by a second signal received at a control terminal of the second transistor;
    combining the first and second currents at the output terminal to generate an amplifier output signal;
    monitoring the first signal, and in accordance therewith, generating a first output signal indicating a condition of the first signal;

monitoring the second signal, and in accordance therewith, generating a second output signal indicating a condition of the second signal;

monitoring the amplifier output signal, and in accordance therewith, generating a third output signal indicating a condition of the amplifier output signal;

generating a shut down signal based on the output signals of the first, second, and third monitor circuits if the output terminal has been electrically shorted to the first or second reference voltages.

13. The method of claim 12, wherein monitoring the first, second, and third signals comprises (i) comparing the first signal to a first threshold, (ii) comparing the second signal to a second threshold, and (iii) comparing the third signal to a third threshold.

14. The method of claim 12, wherein:

generating the first output signal indicating the condition of the first signal comprises generating the first output signal indicating that a voltage of the first signal is above or below a first threshold voltage, generating the third output signal indicating the condition of the amplifier output signal comprises generating the third output signal indicating that a voltage of the amplifier output signal is above or below a second threshold voltage, and generating the second signal indicating the condition of the second signal comprises generating the second signal indicating that a voltage of the second signal is above or below a third threshold voltage.

15. The method of claim 12, wherein monitoring the first signal comprises generating (i) a first current using the first signal and (ii) comparing the first current to a second current.

16. The method of claim 12, wherein monitoring the second signal comprises (i) generating a first current using the second signal and (ii) comparing the first current to a second current.

17. The method of claim 12, wherein monitoring the amplifier output signal comprises comparing a voltage on the amplifier output terminal to a third reference voltage.

18. The method of claim 12, wherein generating the shutdown signal comprises processing the first output signal, second output signal, and third output signal digitally.

19. The method of claim 12, wherein generating the shutdown signal comprises (i) performing a first logical AND operation on the first and third output signals and (ii) performing a second logical AND operation on the second and third output signals.

20. The method of claim 19, wherein generating the shutdown signal comprises performing a logical OR operation on outputs of the first and second logical AND operations.

21. The method of claim 19, wherein generating the shutdown signal comprises (i) performing a logical inversion on the second output signal and (ii) performing a logical inversion on the third output signal.

22. A motor driver system comprising:

a motor having at least a first terminal and a second terminal, wherein (i) the first terminal is coupled to a first amplifier and (ii) the second terminal is coupled to a second amplifier, wherein each amplifier comprises:

an amplifier stage comprising, a first transistor having (i) a first terminal coupled to a first reference voltage, (ii) a second terminal coupled to an amplifier output terminal, and (iii) a control terminal coupled to receive a first signal, a second transistor having (i) a first terminal coupled to the second terminal of the first transistor and the amplifier output terminal, (ii) a second terminal coupled to a second reference voltage, and (iii) a control terminal coupled to receive a second signal, wherein the amplifier stage provides an amplifier output signal through the amplifier output terminal of the amplifier stage;

a first monitor circuit coupled to receive the first signal, the first monitor circuit generating an output signal indicating a condition of the first signal;

a second monitor circuit coupled to receive the second signal, the second monitor circuit generating an output signal indicating a condition of the second signal;

a third monitor circuit coupled to receive the amplifier output signal, the third monitor circuit generating an output signal indicating a condition of the amplifier output signal; and a control circuit coupled to receive the output signals from the first, second, and third monitor circuits, wherein the control circuit generates a shut down signal based on the output signals of the first, second, and third monitor circuits if the output terminal has been electrically shorted to the first or second reference voltages.

* * * * *